United States Patent
Diekmann et al.

(10) Patent No.: US 8,339,034 B2
(45) Date of Patent: Dec. 25, 2012

(54) LIGHTING DEVICE HAVING TWO LIGHT SIDES AND AN ORGANIC LAYER STACK

(75) Inventors: Karsten Diekmann, Rattenberg (DE); Ralph Paetzold, Roth (DE); Wiebke Sarfert, Herzogenaurach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 143 days.

(21) Appl. No.: 12/442,650

(22) PCT Filed: Aug. 28, 2007

(86) PCT No.: PCT/DE2007/001537
§ 371 (c)(1),
(2), (4) Date: Jun. 3, 2009

(87) PCT Pub. No.: WO2008/040275
PCT Pub. Date: Apr. 10, 2008

(65) Prior Publication Data
US 2009/0267502 A1  Oct. 29, 2009

(30) Foreign Application Priority Data
Sep. 29, 2006  (DE) .......................... 10 2006 046 196

(51) Int. Cl.
*H05B 33/00* (2006.01)
(52) U.S. Cl. ....................................... 313/504; 313/506
(58) Field of Classification Search .................. 313/504, 313/506; 428/917, 690
See application file for complete search history.

(56) References Cited

U.S. PATENT DOCUMENTS

| 6,626,554 | B2 | 9/2003 | Rincover et al. |
|---|---|---|---|
| 2001/0000005 | A1 | 3/2001 | Forrest et al. |
| 2004/0061136 | A1 | 4/2004 | Tyan et al. |
| 2004/0195965 | A1 | 10/2004 | Yamazaki et al. |
| 2004/0217700 | A1 | 11/2004 | Chang |
| 2004/0263069 | A1 | 12/2004 | Yamazaki et al. |
| 2005/0012455 | A1 | 1/2005 | Lee et al. |
| 2005/0023973 | A1 | 2/2005 | Huang et al. |
| 2005/0082967 | A1 | 4/2005 | Ryu |
| 2009/0146559 | A1 | 6/2009 | Chan et al. |

FOREIGN PATENT DOCUMENTS

| DE | 102 55 140 A1 | 6/2004 |
|---|---|---|
| EP | 1 394 870 A2 | 3/2004 |
| EP | 1 701 395 A1 | 9/2006 |
| JP | 8-185984 A | 7/1996 |
| JP | 2004-127942 A | 4/2004 |
| WO | WO 01/08230 A1 | 2/2001 |
| WO | WO 03/061028 A2 | 7/2003 |
| WO | WO 03/088371 A2 | 10/2003 |

OTHER PUBLICATIONS

Product Datasheet, OLED Display, 2006, 2 pages, http://www.koditech.co.kr/english/product/product02.html.
Product Datasheet, LCD BLU by PLF™, 2006, 1 page, http://www.koditech.co.kr/english/product/product04.html.

(Continued)

*Primary Examiner* — Joseph L Williams
(74) *Attorney, Agent, or Firm* — Slater & Matsil, L.L.P.

(57) ABSTRACT

A lighting device is disclosed, having a first light output side, a second light output side, and an organic layer stack, disposed between the first and second light output sides, wherein during operation of the lighting device, light with different light properties emerges though the first and the second light output sides.

20 Claims, 5 Drawing Sheets

OTHER PUBLICATIONS

Qiu, C., et al., "Top-Emitting OLED Using Praseodymium Oxide Coated Platinum as Hole Injectors," IEEE Transactions on Electron Devices, vol. 51, No. 7, Jul. 2004, pp. 1207-1210, IEEE.

Lee, C-J., et al., "Mirocavity Effect of Top-emission Organic Light-emitting Diodes Using Aluminum Cathode and Anode," Bulletin of the Korean Chemical Society (BKCS), vol. 26, No. 9, ISSN 0253-2964, Sep. 20, 2005, pp. 1344-1346.

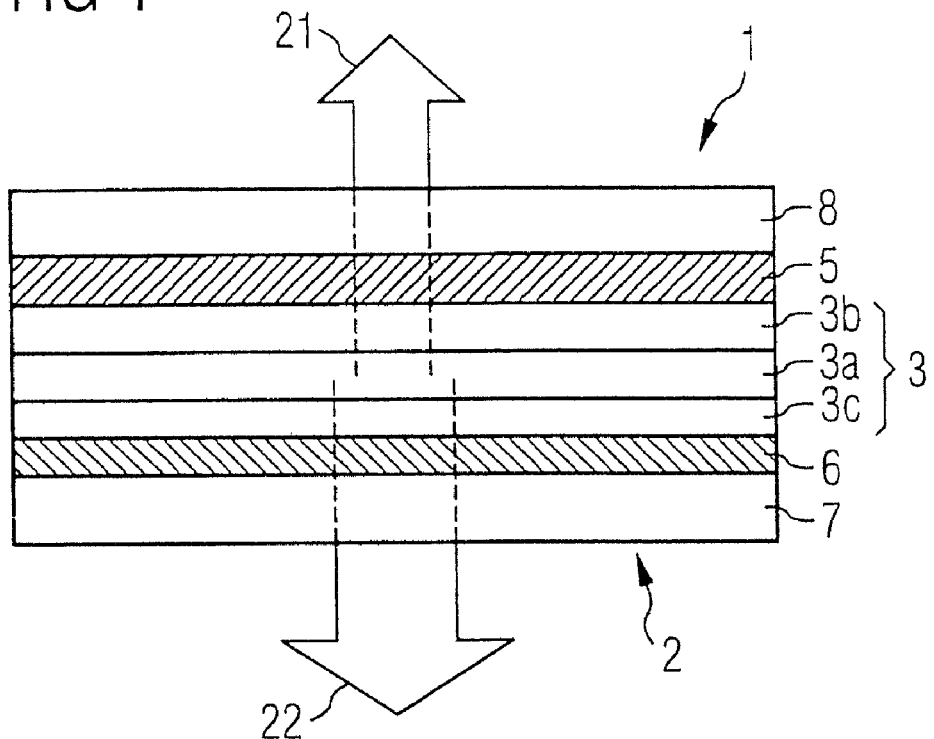
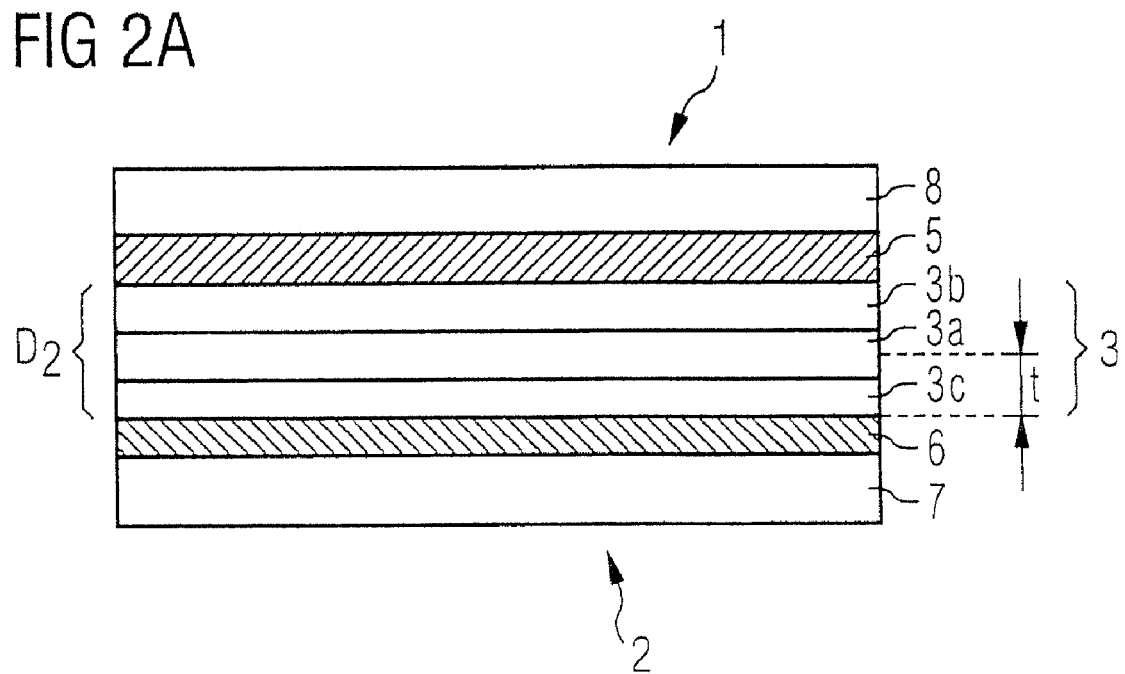

t=0
l=0 t=78 nm
l=4 t=155 nm
l=0.1 t=233 nm
l=3.7

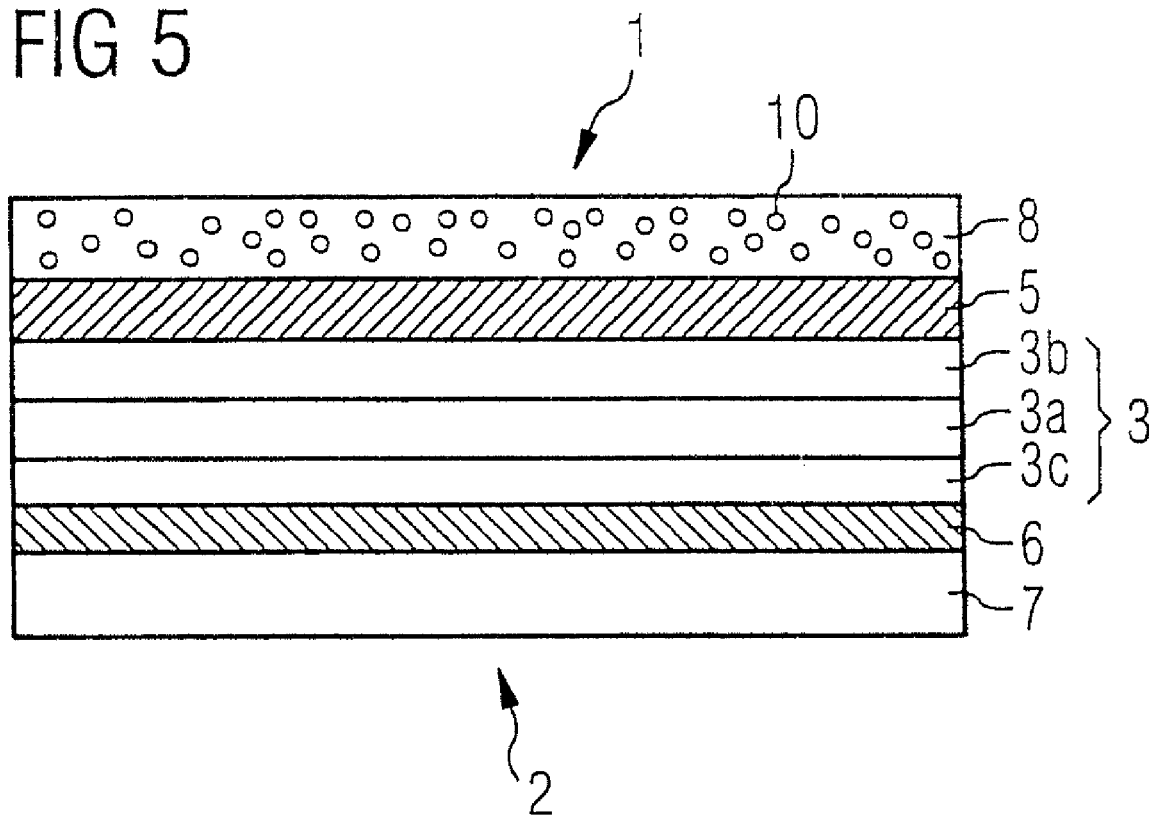

though the first light output side, light with second light properties leaves the lighting device through the second light output side. The first light properties differ from the second light properties. This also means that the lighting device radiates a different light from each of its light output sides.

LIGHTING DEVICE HAVING TWO LIGHT SIDES AND AN ORGANIC LAYER STACK

This patent application claims the priority of the German patent application 10 2006 046 196.7 filed Sep. 29, 2006, whose disclosure content is hereby incorporated by reference.

TECHNICAL FIELD

A lighting device is disclosed.

BACKGROUND

The U.S. Pat. No. 6,626,554 describes a lighting device.

SUMMARY

A problem to be solved is to disclose a lighting device that is particularly versatile in its use.

According to at least one embodiment of the lighting device, the lighting device comprises a first light output side and a second light output side. That is, the lighting device comprises two sides, from which light is emitted during operation of the lighting device. Here, the light output sides are preferably sides of the lighting device that face away from each other. During operation the lighting device emits, for example, light from its front side and from its rear side.

According to at least one embodiment of the lighting device, the lighting device comprises further an organic layer stack, which is disposed between the first and the second light output surface. The organic layer stack comprises at least one organic layer that is provided for generating electromagnetic radiation. A part of the electromagnetic radiation leaves the organic layer stack in the direction of the first light output surface of the lighting device. Another part of the electromagnetic radiation leaves the organic layer stack in the direction of the second light output surface of the lighting device.

Preferably, electrode layers adjoin the organic layer stack. For example, a first electrode layer adjoins the side of the organic layer stack facing toward the first light output side. The side of the organic layer stack facing towards the second light output side adjoins a second electrode layer. The first electrode layer can be, for example, an anode, the second electrode layer can be, for example, a cathode, or vice versa.

The organic layer stack can comprise, along with at least one layer, which is suitable for generating electromagnetic radiation, further organic layers, such as a hole injecting layer, a hole conducting layer, an electron injecting layer and an electron conducting layer.

The hole conducting layer and the hole injecting layer are preferably located on the side of the organic layer stack that faces towards the anode, whereas the electron conducting and the electron injecting layer are preferably located on the side of the layer stack facing towards the cathode.

Here, the organic layer that is suited for generating electromagnetic radiation is disposed preferably between the hole conducting layer and the hole injecting layer on the one side, and the electron conducting and the electron injecting layer on the other side. Preferably, the organic materials of the organic layer stack are constructed to be transparent in particular to light emitted from the organic layer stack.

According to at least one embodiment of the lighting device, during operation of the lighting device, light with different light properties emerges from the lighting device through the first and the second light output sides. This means, light with first light properties leaves the lighting device through the first light output side, light with second light properties leaves the lighting device through the second light output side. The first light properties differ from the second light properties. This also means that the lighting device radiates a different light from each of its light output sides.

According to at least one embodiment of the lighting device, the lighting device comprises a first light output side and a second light output side. Further, the lighting device comprises an organic layer stack that is disposed between a first and second light output side, wherein during operation of the lighting device, light with different light properties emerges through the first and the second light output sides.

A lighting device described here is based on, among others, the following considerations:

For certain applications—for example, for the backlighting of liquid crystal displays—it is desirable to use homogeneously luminescent surface radiation sources as a lighting device. For use in specific products, such as mobile telephones—in particular, flip phones—it is necessary to backlight two liquid crystal displays that are disposed in a very tight space, and for example "back to back" to each other. A lighting device as described here, is particularly well suited to backlighting of two displays, because the displays can be realized in different technologies, so that it is advantageous if the light emerging through the first and the second light output sides is adapted in each case to the properties of the display to be backlit.

According to at least one embodiment of the lighting device, the light emerging through the first light output side differs from the light emerging from the second light output side with respect to its intensity. That is, the light emerging through the first and second light output side has different light properties at least with regard to luminous intensity.

According to at least one embodiment of the lighting device, the light emerging through the first light output side differs from the light emerging from the second light output side with regard to its brightness. That is, the light emerging through the first and second light output side has different light properties at least with regard to brightness.

According to at least one embodiment of the lighting device, the light emerging through the first light output side differs from the light emerging from the second light output side with regard to the emission characteristic. That is, the light emerging through the first and second light output side has different light properties at least with regard to the emission characteristic. This means, for example, that the angular distribution of the intensity relative to the first light output side of the light emerging through the first light output side differs from the angular distribution of the intensity relative to the second light output side of the light emerging through the second light output side.

According to at least one embodiment of the lighting device, the light emerging through the first light output surface differs from the light emerging from the second light output surface with regard to color. That is, the light emerging through the first and second light output side has different light properties at least with regard to color.

For example, white light can leave the lighting device through the first light output side. Then, green, blue, red or light of another color can leave the lighting device through the second light output side.

According to at least one embodiment of the lighting device, at least one light output side of the lighting device comprises a wavelength conversion material.

Wavelength conversion materials are materials that absorb incident light of a first wavelength range, and emit light of a second wavelength range that is different from the first, and as a rule, comprises longer wavelengths than the first wavelength range. Organic materials, such as perylene luminescent substances, can be used as wavelength conversion materials. Furthermore, the following inorganic materials are also suitable for use as wavelength conversion materials: garnets with rare earth metal dopants, alkaline earth sulfides with rare earth metal dopants, thiogallates with rare earth metal dopants, aluminates with rare earth metal dopants, orthosilicates with rare earth metal dopants, chlorosilicates with rare earth metal dopants, alkaline earth silicon nitrides with rare earth metal dopants, and aluminum oxynitrides with rare earth metal dopants.

According to at least one embodiment of the lighting device, the first light output side comprises the wavelength conversion material. Then, the second light output side comprises either no wavelength conversion material, a different wavelength conversion material, an additional wavelength conversion material, or the wavelength conversion material in a different concentration. This makes it possible for light of a different color to emerge from the first and from the second light output sides of the lighting device.

According to at least one embodiment of the lighting device, at least one light output side of the lighting device comprises a color filter material.

The color filter is suitable for filtering light of a specific wavelength range. This means that light of this wavelength range is at least partially absorbed by the color filter. In this way, for example, a first color component can be filtered from white light, a second color component can radiate through the color filter essentially unimpeded. Then, the color subregion with the color filter essentially emits light of the second color component.

The color filter is, embedded in a matrix material, for example in the form of particles of a color filter material.

According to at least one embodiment of the lighting device, the first light output side comprises the color filter material, then the second light output side comprises no color filter material, a different color filter material, an additional color filter material, or the color filter material in a different concentration. In this way, it is possible for light of a different color to be emitted from the first light output side than from the second light output side.

According to at least one embodiment of the lighting device, at least one light output side of the lighting device comprises a light diffusing material. The light diffusing material is suitable for diffuse light through the first light output side which comprises the light diffusing material. Thereby, the angular distribution and the intensity of light emerging through this light output side can be altered.

According to at least one embodiment of the lighting device, the first light output side comprises, for example, the light diffusing material. Then, the second light output side comprises no light diffusing material, a different light diffusing material, an additional light diffusing material, or the light diffusing material in a different concentration.

In this way it is possible that the light emitted from the first and second light output sides differs with regard to the emission characteristic.

According to at least one embodiment of the lighting device, white light is emitted from the second light output side of the lighting device, and colored light is emitted from the first light output side. Here, colored light is to be understood as light that is not white, but rather colored, for example blue, green, red or yellow. Mixtures of the named colors are also possible.

According to at least one embodiment of the lighting device, at least one semitransparent electrode adjoins the organic layer stack. By means of the semitransparent electrode, which has a specific reflectivity and a specific transitivity, the intensity, emission characteristic and the angular distribution of the light emerging through the light output surface of the lighting device can be adjusted. Thus, it is possible, for example, that the emission characteristic of the light emerging through at least one of the light output sides is determined by the distance from the organic layer, provided for the generation of radiation, of the organic layer stack to the semitransparent electrode. This is possible, for example, by utilization of the so-called cavity effect.

BRIEF DESCRIPTION OF THE DRAWINGS

In the following, the lighting device described here is explained in more detail based on exemplary embodiments and the associated figures.

FIG. 1 shows a first exemplary embodiment of a lighting device described here in a schematic sectional view.

FIG. 2A shows a second exemplary embodiment of a lighting device described here in a schematic sectional view.

FIG. 5 shows a fifth exemplary embodiment of a lighting device described here in a schematic sectional view.

DETAILED DESCRIPTION

Figure 2B:
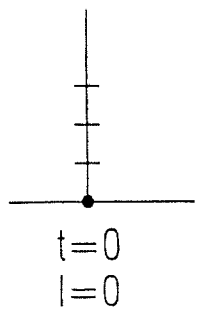
FIGS. 2B, 2C, 2D, 2E show schematically the dependency of the emission intensity I in the forward direction on the distance of the layer provided for generating radiation to the second electrode.
Figure 2C:
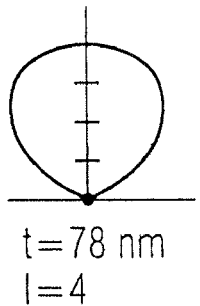
Figure 2D:
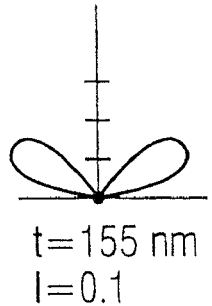
Figure 2E:
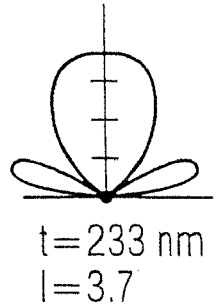

In the exemplary embodiments and Figures, equivalent components or components that have the same effect, are designated in each case with the same reference numbers. The represented elements are not to be regarded as true to scale; rather, individual elements can be represented in exaggerated size for improved comprehension.

FIG. 1 shows a first exemplary embodiment of a lighting device described here in a schematic sectional view.

The lighting device according to the first exemplary embodiment comprises a substrate 8. The substrate 8 is constructed to be transparent to light. Here, the substrate 8 can be constructed to be transparent or diffuse dispersing—for example, like a pane of frosted glass. The substrate 8 is formed, for example, from a glass or a plastic film.

A first electrode 5 is applied to the substrate 8. The first electrode 5 can be an anode or a cathode. The first electrode 5 is preferably constructed to be permeable to radiation.

An organic layer stack 3 follows the first electrode 5 on the side thereof facing away from the substrate 8. The organic layer stack 3 comprises one or more organic layers. One of the organic layers 3a is preferably provided for generating radiation. The organic layer stack 3 can comprise further organic layers 3b, 3c, which are suitable, for example, for conducting and/or injecting charge carriers into the layer 3a provided for generating radiation.

On the side of the organic layer stack 3 facing away from the first electrode 5, a second electrode 6 follows. If the first electrode is an anode, the second electrode 6 is a cathode. If the first electrode 5 is a cathode, the second electrode 6 is an anode. The second electrode 6 is preferably constructed to be permeable to light.

An encapsulation 7 is applied to the side of the second electrode 6 facing away from the organic layer stack 3. The encapsulation 7 is constructed to be permeable to light. Here, the encapsulation 7 can be constructed optically diffuse dispersing—for example, like a pane of frosted glass, or transparent. The encapsulation 7 is formed, for example from a glass or a plastic film. Further, the encapsulation 7 can be a thin film encapsulation.

A thin film encapsulation has at least one barrier layer. The barrier layer is provided to protect the organic layer stack and sensitive electrode materials from penetration by damaging substances, for instance moisture and oxygen.

A thin film encapsulation comprises at least one thin film layer, for example the barrier layer, which is applied by means of a thin film method, such as sputtering, vaporizing, and plasma supported CVD (chemical vapor deposition).

Preferably, the thin film encapsulation comprises multiple alternating barrier layers, wherein at least two barrier layers that are different with respect to their material composition, are arranged in a regular sequence. In other words, the thin film encapsulation comprises first and second barrier layers, wherein the material composition of the first barrier layers is different from the material composition of the second barrier layers. The first barrier layers can comprise, for example, silicon oxide or can be composed of this material, and the second barrier layer can comprise, for example, silicon nitride or can be composed of this material. Furthermore, the first and second barrier layers are arranged alternately with respect to their material composition.

Such an alternating layer sequence of barrier layers within the thin film encapsulation offers the advantage that the thin film encapsulation has a particularly well sealed construction. As a rule, this stems from the fact that pinholes—i.e., small holes—that can develop in the respective barrier layer during its application, can be covered by the barrier layer lying on top of them, or can be filled by its material. Furthermore, the probability that a pinhole from one barrier layer produces a continuous connection to a pinhole from the adjacent barrier layer is extremely low. This is particularly true for barrier layers that are arranged alternately with respect to their material composition.

Particularly preferably, one of the alternating barrier layers comprises silicon oxide, and the other alternating barrier layer comprises silicon nitride. For example, a first barrier layer can be composed of $SiO_2$, and a second barrier layer can be composed of $Si_3N_4$.

The lighting device according to the exemplary embodiment of FIG. 1 has a first light output side 1. The first light output side 1 is disposed on the side of the substrate 8 facing away from the organic layer stack 3. Light 21 with first light properties leaves the lighting device through the first light output side 1.

Further, the lighting device has a second light output side 2, which is disposed on the side of the encapsulation 7 facing away from the organic layer stack. Light 22 with the second light properties leaves the lighting device through the second light output side 2.

The light 21 with first light properties differs from the light 22 with second light properties. That is, the lighting device emits light 21, 22 with different properties through the first and second light output sides 1, 2.

FIG. 2A shows a second exemplary embodiment of a lighting device described here in a schematic sectional view.

In this exemplary embodiment the second electrode 6 forms a cathode. The cathode is constructed at least partially reflecting for electromagnetic radiation generated in the organic layer 3a provided for generating radiation. The organic layer 3a provided for generating radiation is suitable, for example, for generating light with a wavelength of 530 nanometers and has a refractive index of 1.7. The organic layer 3a provided for generating radiation is placed at a distance t from the second electrode 6.

The FIGS. 2B, 2C, 2D, and 2E show schematically the emission intensities I, in arbitrary units, of the light 21 in the forward direction—that is, in the direction of the first light output side 1—plotted against the distance t of the layer 3a, provided for generating radiation, from the second electrode 6. Due to the so-called cavity effect, the intensity I and its angular distribution depend on the distance t. Therefore, the emission characteristic of the light emitted through the first light output side 1 can be systematically adjusted by means of the distance t.

Figure 2F:
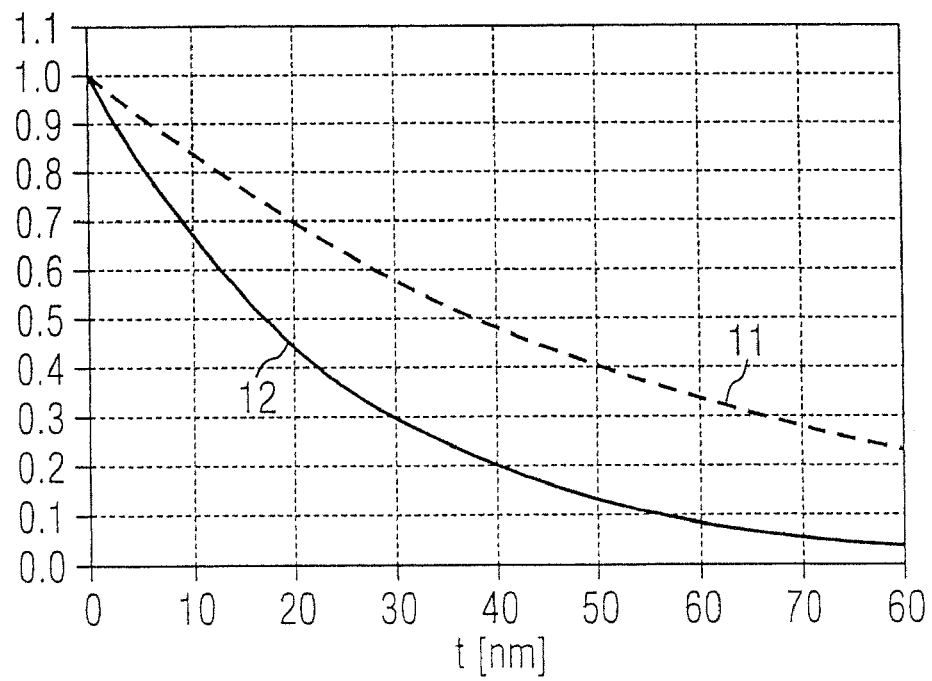
FIG. 2F shows the simulated distribution of green and blue excitons in a white broadband emitter layer.

The layer 3a provided for generating radiation can be, for example, an organic layer with a white broadband emitter. In this white broadband emitter, the decomposition zones for excitons can have different sites for different colors. Due to the cavity effect described in connection with FIGS. 2B to 2E, this means that a color-selective adjustment of the light radiated through the light output sides 1, 2 can be achieved. FIG. 2F also shows the simulated distribution of green 11 and blue excitons 12 in an organic layer 3a provided for generating radiation that includes a white broadband emitter material. In this case, the blue excitons are located on average much closer to the boundary surface between the organic layer stack 3 and the first electrode 5.

If, for example, two semitransparent electrodes are used in the lighting device, which each have a specific reflectivity, then, utilizing the cavity effect, a different colored light emission can be obtained through the first and second light output sides 1, 2. Here, the two electrodes can also have different reflectivities.

Figure 3A:
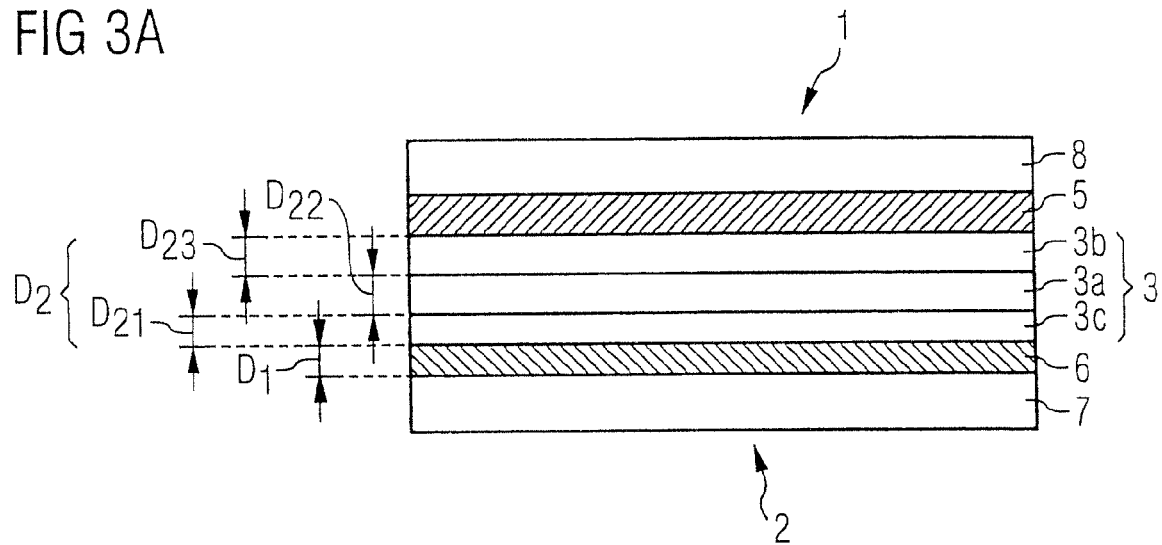
FIG. 3A shows a third exemplary embodiment of a lighting device described here in a schematic sectional view.

FIG. 3A shows a third exemplary embodiment of a lighting device described here in a schematic sectional view. The light means according to the third exemplary embodiment comprises a transparent first electrode 5 that forms an anode. The anode is suitable for injecting holes into the organic layer stack 3. Preferably, the anode has a material that has a high output work function for electrons, such as indium tin oxide (ITO).

The first electrode 5 is followed by the organic layer stack 3, which in this case has a hole conducting layer 3b that is formed from a polymer, for example, PEDOT. The hole conducting layer 3b has a thickness D23 of 120 nanometers. The hole conducting layer 3b is followed by the organic layer 3a provided for generating radiation which here has a thickness D22 of 80 nanometers and is formed of LEP. The organic layer 3a provided for generating radiation is followed by an electron conducting layer 3c that is formed of Ca, and has a thickness D21 of three nanometers. The second electrode 6, which is here composed of silver and has a thickness D1 of ten nanometers, is applied onto the electron conducting layer 3c. The second electrode 6 forms a cathode, which has a low output work function for electrons.

The cathode forms a semitransparent reflector, in which a specific transmission refection behavior is set by means of the layer thickness D1. The color components and the intensity of the light 22 emerging from the second electrode 6—that is, that light which leaves the lighting device through the second light output side 2—can be adjusted by means of the thickness D1 of the second electrode 6.

Figure 3B:
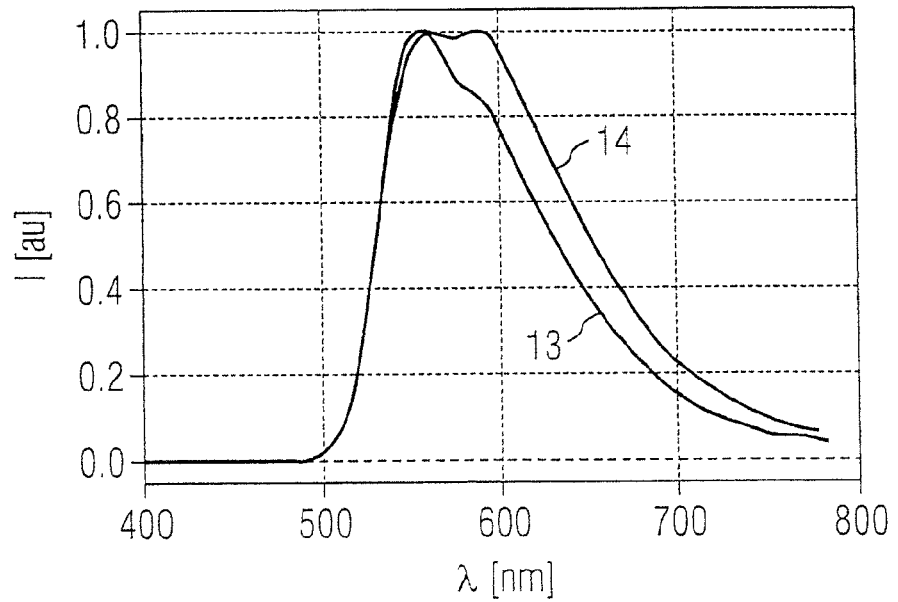
FIG. 3B shows a plot of the intensity of the light emitted through the first and second light output sides against the wavelength of the light.

In relation to this, FIG. 3B shows a plot of the intensity of the light 21 emitted through the first light output side 1 (curve 14), and the light 22 emitted through the second light output side 2 (curve 13), against the wavelength of the light.

Figure 4A:
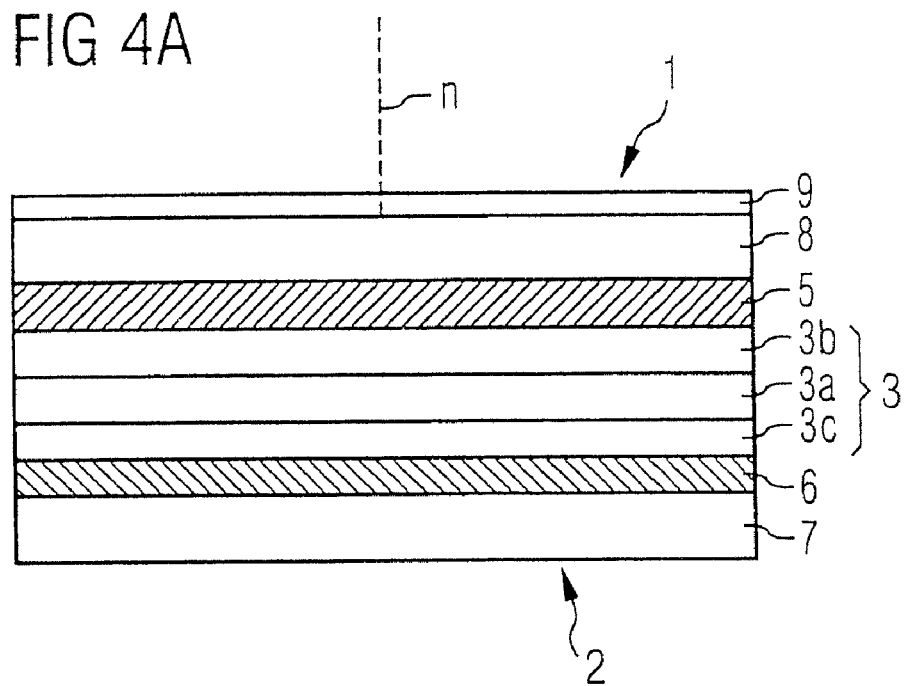
FIG. 4A shows a fourth exemplary embodiment of a lighting device described here in a schematic sectional view.

FIG. 4a shows a fourth exemplary embodiment of a lighting device described here in a schematic sectional view. In the exemplary embodiment of FIG. 4a, a diffusion film is applied to the side of the substrate 8 facing away from the organic layer stack 3. The diffusions film is 50 micrometers thick and has 50 percent by weight of particles of a material that is suitable for diffusing light. The particles can be, for example, polymer spheres in a polymer matrix. That is, the first light output side 1 in the exemplary embodiment of FIG. 4A comprises a material that is light diffusing. This means that the color components, as well as the intensity of the light 21 released through the first light output side 1 can be modified.

Figure 4B:
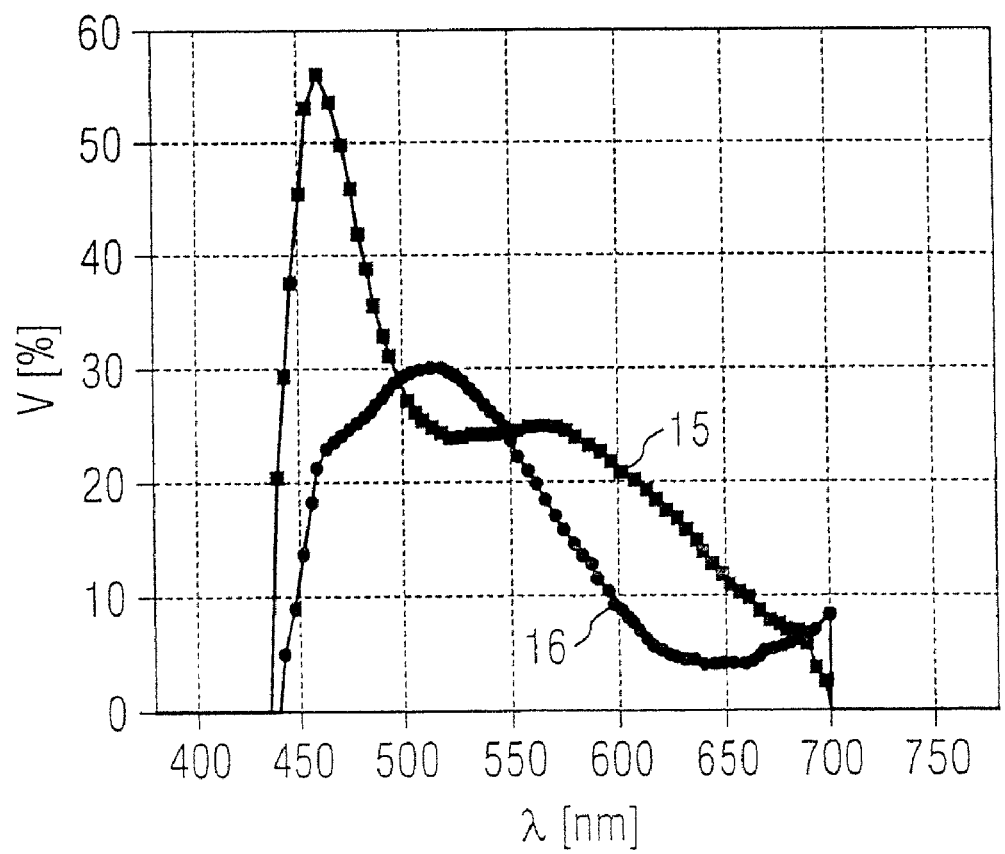
FIG. 4B shows the emission improvement plotted against the wavelength of the light emitted from the first light output side.

FIG. 4B shows the emission improvement V in percent plotted as a function of the wavelength of the light 21 emitted from the first light output side for an angle of 0 degrees (curve 15) relative to the surface normal n, and an angle of 60 degrees (curve 16) relative to the surface normal n.

FIG. 5 shows a fifth exemplary embodiment of a lighting device described here in a schematic sectional view. In this exemplary embodiment, particles 10 of a color filter and/or wavelength conversion material are introduced into the substrate 8 of the lighting device. That is, the first light output side 1 comprises a color filter material and/or a wavelength conversion material.

The organic layer 3a provided for generating radiation is suitable, for example, for emitting blue light. The particles 10 can be, for example, particles of a yellow re-emitting or a red-green re-emitting wavelength conversion material. In this way, a white mixed light is emitted from the first light output side 1. Blue light is emitted from the second light output side 2.

Alternatively, it is also possible, for example, that the organic layer 3a provided for generating radiation is suitable for generating white light. In that case, the particles 10 can be, for example, a green color filter material. In this way, white light is emitted from the second light output side 2. Green light is emitted from the first light output side 1.

In addition to a use as a lighting device for backlighting displays, a lighting device described here is also suitable as a two color room divider, or as effect lighting, in which the lighting device is constructed in a freely selectable shape and is rotationally mounted. In this manner, using a fast rotation of the lighting device, a two color lighting effect can be created—similar to a strobe light.

Further, it is possible for the lighting device to be used in a window application. If the entire window is coated with the lighting device, then it is possible to create a lighting device that is transparent during the day, and during the night radiates essentially only inwards. For this purpose, the electrode of the lighting device facing towards the outside is constructed to be semitransparent, in such a manner that it is reflective for light generated in the organic layer 3a provided for generating radiation.

The invention is not limited by the description based on the exemplary embodiments. Rather, the invention comprises each new feature, as well as any combination of features, which includes in particular every combination of features in the patent claims, even if this feature or this combination itself is not explicitly specified in the patent claims or exemplary embodiments.

The invention claimed is:

1. A lighting device comprising:
   a first light output side,
   a second light output side, and
   an organic layer stack disposed between the first light output side and second light output side, wherein the organic layer stack is configured such that, during operation of the lighting device, light of a first color emerges through the first light output side and light of a second color emerges through the second light output side, the first color different from the second color, wherein the color of the light that emerges from the first light output side and from the second light output side is adjusted by the cavity effect.

2. The lighting device according to claim 1, wherein the light emerging through the first light output side differs from the light emerging through the second light output side with regard to intensity.

3. The lighting device according to claim 1, wherein the light emerging through the first light output side differs from the light emerging through the second light output side with regard to brightness.

4. The lighting device according to claim 1, wherein the light emerging through the first light output side differs from the light emerging through the second light output side with regard to an emission characteristic.

5. The lighting device according to claim 4, wherein at least one light output side comprises a light diffusing material.

6. The lighting device according to claim 1, wherein at least one light output side comprises a wavelength conversion material.

7. The lighting device according to claim 1, wherein at least one light output side comprises a color filter material.

8. The lighting device according to claim 1, further comprising at least one semitransparent electrode which adjoins the organic layer stack.

9. The lighting device according to claim 8, wherein white light is emitted from the second light output side, and colored light is emitted from the first light output side.

10. The lighting device according to claim 8, wherein an emission characteristic of the light emerging through one of the light output sides depends on a distance from an organic layer, provided for generating radiation, to the semitransparent electrode.

11. The lighting device according to claim 8, wherein a further emission characteristic of the light emerging through one of the light output sides is adjusted by utilization of the cavity effect, the further emission characteristic being different than color.

12. A method of generated light, the method comprising:
   providing a lighting device according to claim 1; and
   operating the lighting device so that light with different light properties emerges through the first light output side and the second light output side, and a color of the light that emerges from the first light output side and from the second light output side is adjusted by the cavity effect.

13. The method according to claim 12, wherein the light emerging through the first light output side differs from the light emerging through the second light output side with regard to color.

14. The method according to claim 12, wherein the lighting device further comprises at least one semitransparent electrode which adjoins the organic layer stack.

15. The method according to claim 14, wherein the lighting device comprises a layer provided for generating radiation which is an organic layer with a white broadband emitter, wherein the white broadband emitter includes decomposition zones for excitons have different sites for different colors including at least blue and green, wherein decomposition zones for blue excitons are located on average closer to a boundary surface between the organic layer stack and the electrode than the decomposition zones for green excitons.

16. A lighting device comprising:
a first light output side,
a second light output side, and
an organic layer stack disposed between the first light output side and second light output side, wherein, during operation of the lighting device, light with different light properties emerges through the first light output side and the second light output side, and a color of the light that emerges from the first light output side and from the second light output side is adjusted by the cavity effect;
at least one semitransparent electrode which adjoins the organic layer stack; and
a layer provided for generating radiation which is an organic layer with a white broadband emitter, wherein the white broadband emitter includes decomposition zones for excitons have different sites for different colors including at least blue and green, wherein decomposition zones for blue excitons are located on average closer to a boundary surface between the organic layer stack and the electrode than the decomposition zones for green excitons.

17. A lighting device comprising:
a first light output side;
a second light output side; and
an organic layer stack disposed between the first light output side and second light output side,
wherein the organic layer stack is configured such that, during operation of the lighting device, light of a first color emerges through the first light output side and light of a second color emerges through the second light output side, the first color different from the second color,
wherein the color of the light that emerges from the first light output side and from the second light output side is adjusted by the cavity effect, and
wherein white light is emitted from the second light output side and colored light is emitted from the first light output side.

18. The lighting device according to claim 17, wherein blue light is emitted from the first light output side.

19. The lighting device according to claim 17, wherein green light is emitted from the first light output side.

20. The lighting device according to claim 17, wherein red light is emitted from the first light output side.

* * * * *